United States Patent
Kamishima

(10) Patent No.: US 7,379,833 B2
(45) Date of Patent: May 27, 2008

(54) OFFSET CORRECTION APPARATUS AND OFFSET CORRECTION METHOD FOR AUTOMOTIVE VOLTAGE SENSOR

(75) Inventor: Utaka Kamishima, Kawasaki (JP)

(73) Assignee: Nissan Motor Co., Ltd., Yokohama-shi (JP)

( * ) Notice: Subject to any disclaimer, the term of this patent is extended or adjusted under 35 U.S.C. 154(b) by 0 days.

(21) Appl. No.: 11/300,466

(22) Filed: Dec. 15, 2005

(65) Prior Publication Data

US 2006/0136163 A1    Jun. 22, 2006

(30) Foreign Application Priority Data

Dec. 17, 2004    (JP)    ............... 2004-365871

(51) Int. Cl.
*G01C 25/00*    (2006.01)
*G01R 31/04*    (2006.01)

(52) U.S. Cl. ............... 702/104; 318/700; 702/58; 702/64

(58) Field of Classification Search ............... 702/91, 702/93, 104, 116, 113, 58, 64; 180/446; 318/432, 608, 700; 701/221
See application file for complete search history.

(56) References Cited

U.S. PATENT DOCUMENTS 6,515,446 B1 *    2/2003    Koide et al. ............... 318/700

FOREIGN PATENT DOCUMENTS

| JP | 2000-137062 A | 5/2000 |
|---|---|---|
| JP | 2004-109092 A | 4/2004 |
| JP | 2004-109093 A | 4/2004 |

* cited by examiner

*Primary Examiner*—John Barlow
*Assistant Examiner*—John Le
(74) *Attorney, Agent, or Firm*—Foley & Lardner LLP

(57) ABSTRACT

After a vehicle is started up, a voltage value detected by a voltage sensor while a voltage detection target and the voltage sensor are disconnected from each other is obtained as an offset voltage, and the voltage value detected by the voltage sensor is corrected based upon the offset voltage thus obtained.

9 Claims, 7 Drawing Sheets

OFFSET CORRECTION APPARATUS AND OFFSET CORRECTION METHOD FOR AUTOMOTIVE VOLTAGE SENSOR

BACKGROUND OF THE INVENTION

1. Field of the Invention

The present invention relates to an apparatus and a method to be adopted in offset correction of a voltage sensor installed and used in a vehicle.

2. Description of Related Art

There is an apparatus known in the related art that executes offset correction processing for a voltage sensor when battery charge/discharge is in an OFF state, i.e., when the input/output current at the battery is 0 (see Japanese Laid Open Patent Publication No. 2000-137062).

SUMMARY OF THE INVENTION

However, when the apparatus in the related art is adopted in conjunction with a voltage sensor installed in a vehicle, the following problem may arise. Namely, when the vehicle is in a traveling state during which the battery is charged or discharged, offset correction for an offset error caused by fluctuation of the temperature at the voltage sensor cannot be executed.

It would be desirable to provide an offset correction apparatus for an automotive voltage sensor which includes a connection/disconnection device that connects/disconnects a voltage sensor and a voltage detection target to/from each other, an offset voltage obtaining device that obtains as an offset voltage a voltage value detected by the voltage sensor while the voltage detection target and the voltage sensor are disconnected from each other by the connection/disconnection device, and a voltage correction device that corrects the voltage value detected by the voltage sensor based upon the offset voltage obtained by the offset voltage obtaining device.

It would be also desirable to provide an offset correction method for an automotive voltage sensor including steps for obtaining, as an offset voltage, a voltage value detected by a voltage sensor while a voltage detection target and the voltage sensor are disconnected from each other, and correcting a voltage value detected by the voltage sensor based upon the offset voltage having been obtained.

DETAILED DESCRIPTION OF PREFERRED EMBODIMENT

Figure 1:
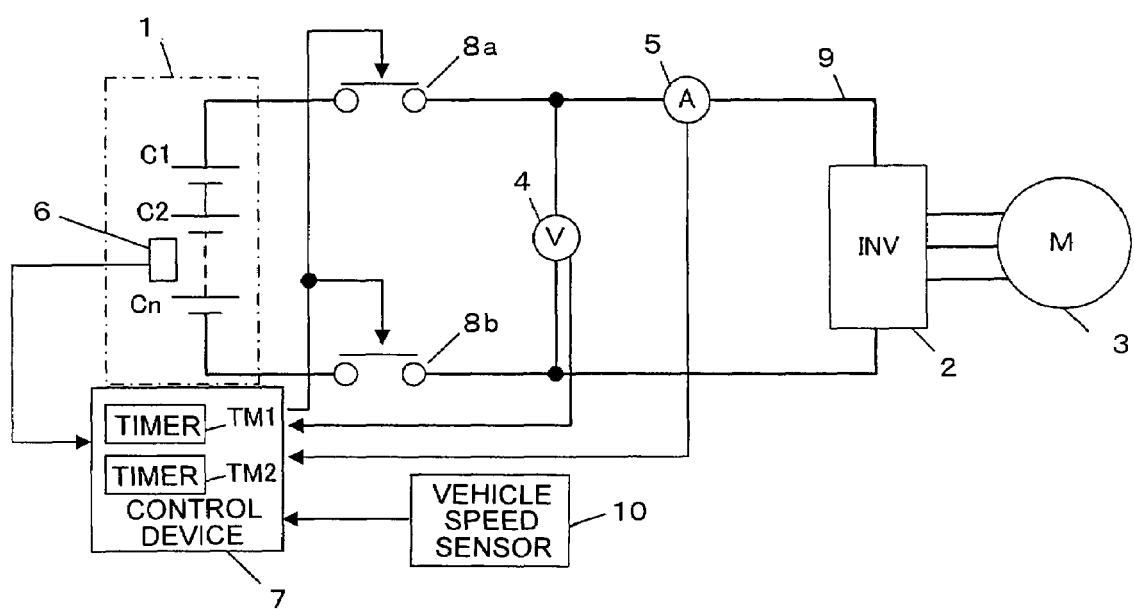
FIG. 1 shows the drive system of an electric car equipped with the offset correction apparatus for an automotive voltage sensor achieved in an embodiment.

FIG. 1 shows the drive system of an electric car equipped with the offset correction apparatus for an automotive voltage sensor achieved in an embodiment. A battery module 1 is constituted by connecting a plurality of cells C1 to Cn in series. A DC voltage from the battery module 1 is converted to 3-phase AC voltage at an inverter 2 and the 3-phase AC voltage is then applied to a 3-phase AC motor 3, which is a traveling drive source of the electric car. Ferroelectric relays 8a and 8b are disposed at a ferroelectric harness 9 connecting the battery module 1 to the inverter 2. ON/OFF control of the ferroelectric relays 8a and 8b is executed by a control device 7.

A voltage sensor 4 detects the total voltage of the battery module 1. A current sensor 5 detects a charge current and a discharge current (hereafter collectively referred to as a charge/discharge current CURBT (A)) at the battery pack 1. The current sensor 5 detects the charge current as a positive value and detects the discharge current as a negative value. A thermistor 6 detects the temperature at the battery module 1. A vehicle speed sensor 10 detects the vehicle speed.

Figure 2:
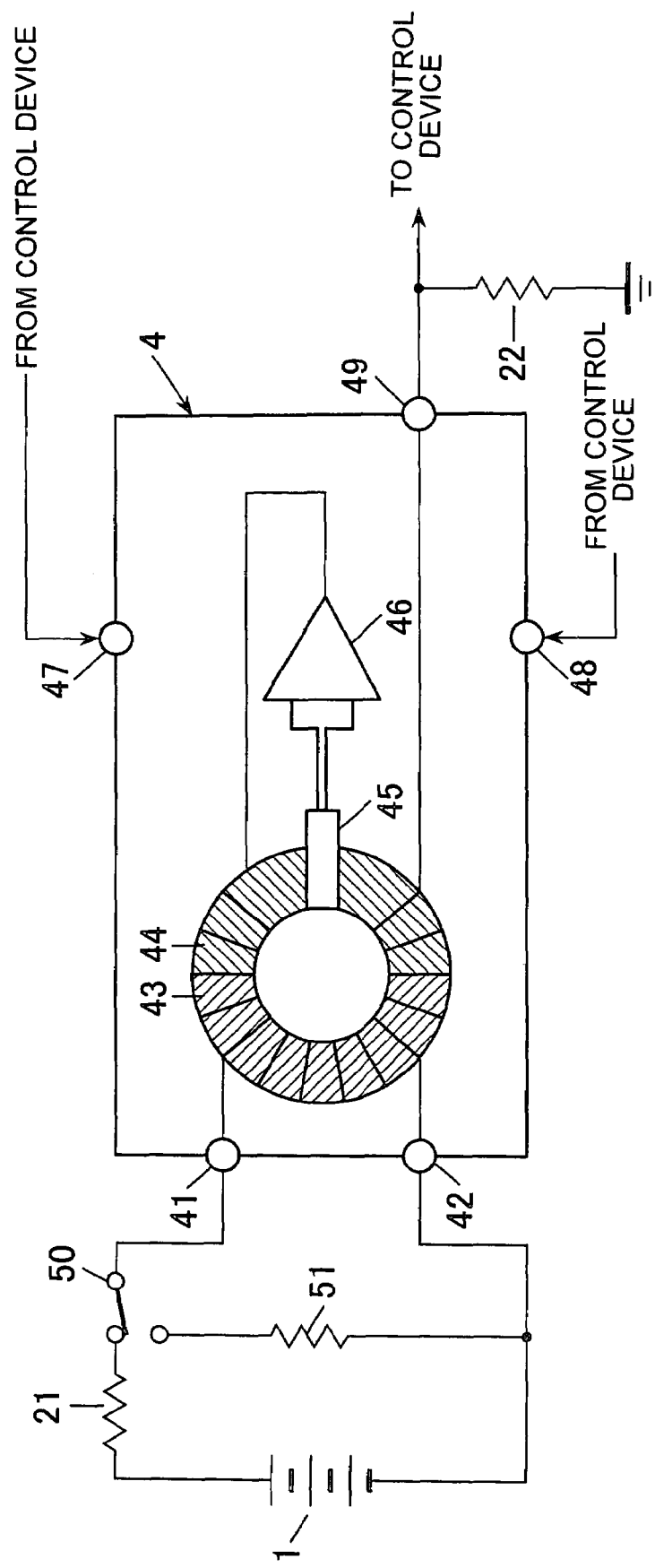
FIG. 2 shows in detail the structure of the voltage sensor.

FIG. 2 shows the structure adopted in the closed loop voltage sensor 4 in detail. The voltage sensor 4 includes a measurement target voltage input terminal 41 disposed on the positive side, a measurement target voltage input terminal 42 disposed on the negative side, a primary coil 43, a secondary coil 44, a hall element 45, an operational amplifier 46, a power supply terminal 47 disposed on the positive side, a power supply terminal 48 disposed on the negative side and an output terminal 49.

A current flowing from the positive electrode of the battery module 1 first reaches the primary coil 43 via a primary input resistor 21 and the positive-side measurement target voltage input terminal 41 and then flows to the negative pole of the battery module 1 via the negative-side measurement target voltage input terminal 42. The hall element 45 outputs a voltage corresponding to the magnetic flux generated at the primary coil 43. The operational amplifier 46 amplifies the voltage generated at the hall element 45 and outputs the amplified voltage. The secondary coil 44 adjusts the magnetic flux by feeding back the electrical current output from the operational amplifier 46 to the primary coil 43.

The current guided to the secondary coil 44 as the current flows to the primary coil 43 is input to the control device 7 via the output terminal 49. A value indicating the voltage achieved through current-voltage conversion is input to the control device 7 via an output resistor 22. It is to be noted that power is supplied to the voltage sensor 4 from the control device 7 via the power supply terminals 47 and 48.

A voltage detection switch 50 is disposed between the primary input resistor 21 and the positive-side measurement target voltage input terminal 41. The voltage detection switch 50 is in an on state while the voltage detection switch 50 is connected with a terminal located at the primary input resistor 21. The voltage sensor 4 is enabled to detect the voltage of the battery module 1 in this state. The voltage detection switch 50 is in an OFF state while the voltage detection switch 50 is connected with a terminal located at a discharge resistor 51. In this state, no voltage is applied between the measurement target voltage input terminals 41 and 42. The voltage value detected by the voltage sensor 4 in this state indicates an offset voltage value VOFSET of the voltage sensor 4.

Figure 3:
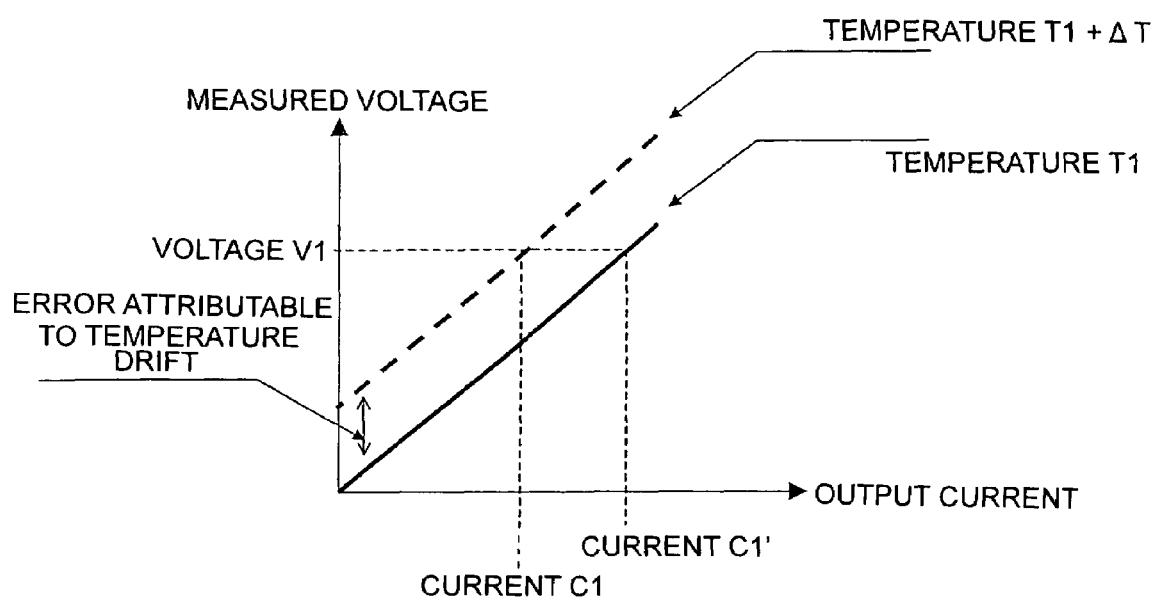
FIG. 3 shows the temperature drift characteristics of the voltage sensor.

FIG. 3 shows the temperature drift characteristics of the voltage sensor 4. As the temperature T1 at the voltage sensor 4 rises by ΔT, the current output from the output terminal 49 of the voltage sensor 4 changes even if the voltage of the battery module 1 does not fluctuate from V1. The temperature of the voltage sensor 4 may fluctuate while the vehicle is traveling and, for this reason, it is particularly important to execute offset correction for the voltage sensor 4, i.e., correction of the offset voltage VOFSET, while the vehicle is traveling. The offset correction apparatus for an automotive voltage sensor achieved in the embodiment executes offset correction for the voltage sensor 4 while the vehicle is traveling, as well as immediately after the vehicle is started.

Figure 4:
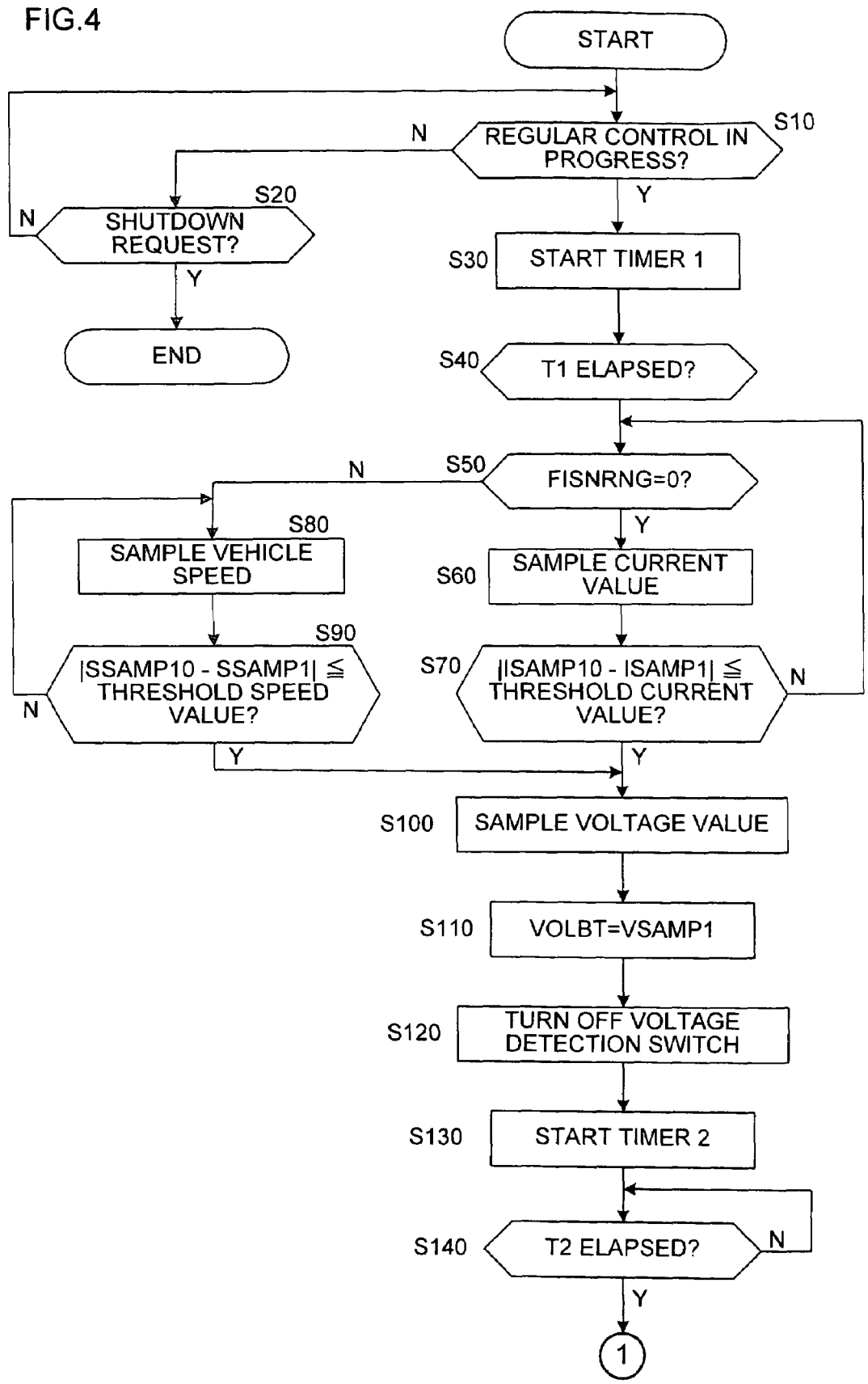
FIG. 4 presents a flowchart of the contents of the processing executed by the control device.
Figure 5:
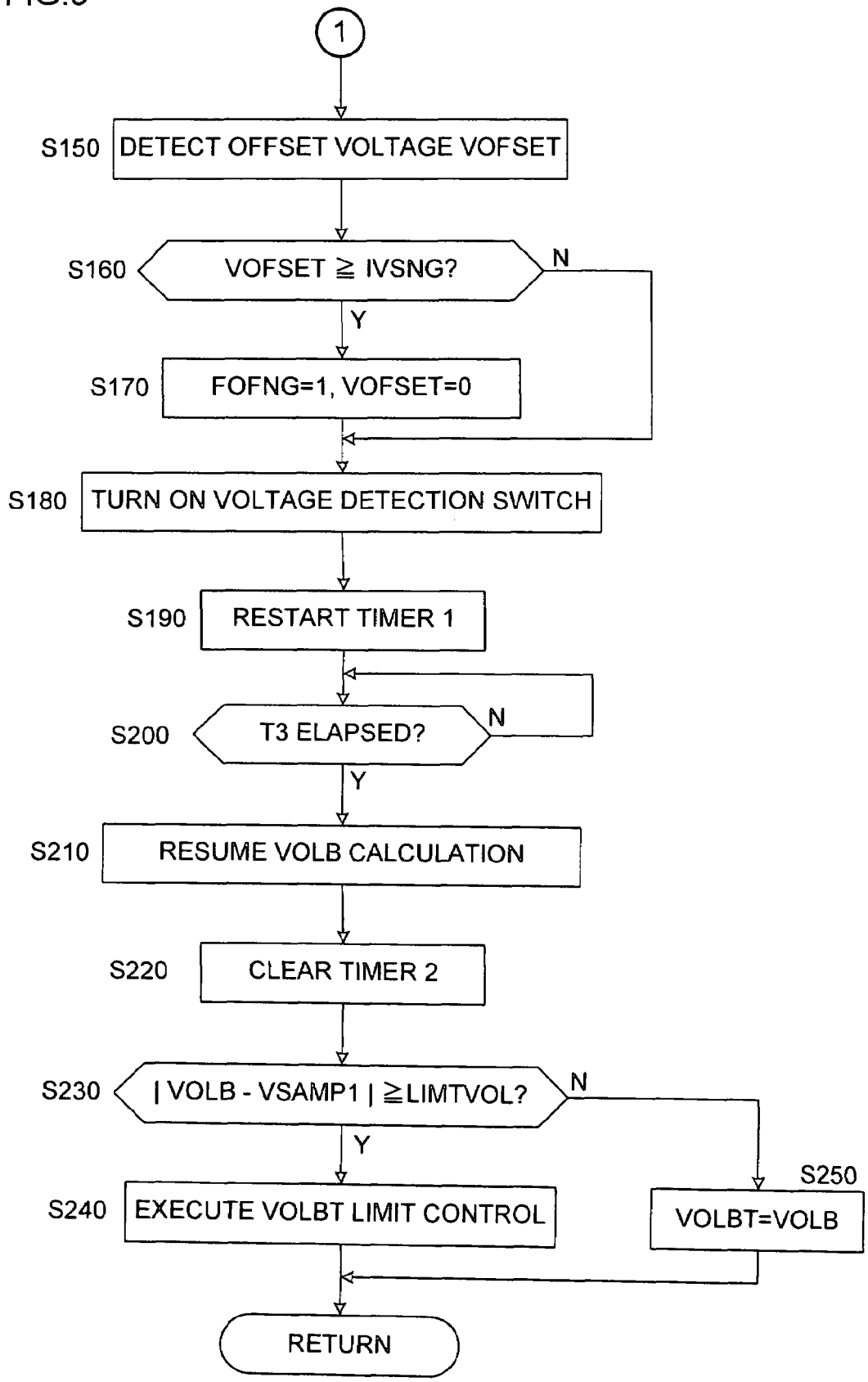
FIG. 5 presents a flowchart of the processing in continuation from the flowchart in FIG. 4.

FIGS. 4 and 5 present a flowchart of the contents of the processing executed by the control device 7. As the ignition switch (not shown) is turned on, the control device 7 starts the processing in step S10. In step S10, a decision is made as to whether or not regular control is in progress. The operation proceeds to step S20 if it is decided that regular control is not in progress, and a decision is made in step S20 as to whether or not a shutdown request has been issued. If the ignition switch (not shown) has been turned off and thus it is decided that a shutdown request has been issued, the processing in the flowchart presented in FIG. 4 ends.

If, on the other hand, it is decided in step S10 that the regular control is in progress, the operation proceeds to step S30. It is to be noted that during the regular control, the charge/discharge current CURBT (A) at the battery module 1 is detected, a control battery voltage VOLBT (V) is calculated and a battery voltage VOLB (V) is calculated. The control battery voltage VOLBT (V) is the value of the voltage from the battery module 1, which is used to control the vehicle and the value of the battery voltage VOLB (V) calculated as indicated in (1) below is used for the control battery voltage VOLBT (V) under normal circumstances.

$$VOLB = ADVOL \times VOLMAX / (IVOUT \times RSOUT) \quad (1)$$

with ADVOL (V) representing the voltage value input to the control device 7 via the output terminal of the voltage sensor 4, VOLMAX (V) representing the maximum measured voltage at the voltage sensor 4, IVOUT (A) representing the current value output from the voltage sensor 4 and RSOUT (Ω) representing the resistance value at the output resistor 22.

It is to be noted that the value of the voltage of the battery module 1, which is used in the actual vehicle control, is a value obtained by subtracting the offset voltage value VOFSET from the control battery voltage VOLBT.

In step S30, an internal timer TM1 at the control device 7 is started, and then the operation proceeds to step S40. In step S40, a decision is made as to whether or not the length of time being counted by the timer TM1 has reached a predetermined length of time T1. The predetermined length of time T1 indicates the execution cycle over which the offset correction is to be executed. The operation waits in standby in step S40 if it is decided that the length of time counted with the timer TM1 has not reached the predetermined length of time T1, whereas the operation proceeds to step S50 if it is decided that the predetermined length of time T1 has elapsed.

In step S50, a decision is made as to whether or not a current detection system error flag FISNRNG is currently set to 0, i.e., whether or not an abnormality has occurred at the current detection system. The control device 7 executes a failure diagnosis for the current detection system with a given timing, and if it is judged that an abnormality has occurred, it sets the current detection system error flag FISNRNG to 1. If it is decided that the current detection system error flag FISNRNG is at 0, the operation proceeds to step S60, whereas if the current detection system error flag FISNRNG is at 1, indicating that an abnormality has occurred in the current detection system, the operation proceeds to step S80.

In step S60, the charge/discharge current CURBT at the battery module 1 is sampled every 10 ms to obtain 10 sets of sampled data. In the explanation, the 10 current values indicated in the sampled data are referred to as ISAMP1 through ISAMP10. Once the current values ISAMP1 through ISAMP10 are detected, the operation proceeds to step S70. In step S70, a decision is made as to whether or not the relationship expressed in (2) below is true.

$$|ISAMP10 - ISAMP1| \leq \text{predetermined threshold value current} \quad (2)$$

If it is decided that the relationship expressed in (2) is true, the operation proceeds to step S100 to execute offset correction for the voltage sensor 4. If, on the other hand, it is decided that the relationship expressed in (2) is not true, the operation returns to step S50. Namely, the offset correction processing for the voltage sensor 4 is executed if it can be judged that the vehicle is in a steady traveling state because the charge/discharge current CURBT at the battery module 1 only fluctuates to a small extent.

In step S80, the vehicle speed sensor 10 samples the vehicle speed every 10 ms to obtain 10 sets of sampled data. In the explanation, the 10 vehicle speed values indicated in the sampled data are referred to as SSAMP1 through SSAMP10. Once the vehicle speed values SSAMP1 through SSAMP10 are detected, the operation proceeds to step S90. In step S90, a decision is made as to whether or not the relationship expressed in (3) below is true.

$$|SSAMP10 - SSAMP1| \leq \text{predetermined vehicle speed} \quad (3)$$

If it is decided that the relationship expressed in (3) is true, the operation proceeds to step S100, whereas if it is decided that the relationship expressed in (3) is not true, the operation returns to step S80. Namely, the offset correction processing for the voltage sensor 4 is executed if it can be judged that the vehicle is in a steady traveling state because the vehicle speed fluctuates to a small extent.

In step S100, the value VOLB of the voltage at the battery module 1 is calculated over 10 ms, and the voltage value VOLB thus calculated is designated as VSAMP1, before the operation proceeds to step S110. In step S110, the calculation of the voltage value VOLB is interrupted to detect the offset voltage value VOFSET at the voltage sensor 4 and the value of the control battery voltage VOLBT is fixed to VSAMP1. Namely, while the offset voltage is being ascertained, the voltage value VSAMP1 having been calculated immediately before the processing for obtaining the offset voltage is executed is used as the value for the control battery voltage VOLBT.

In step S120, which follows step S110, the voltage detection switch 50 is turned off. In other words, the voltage detection switch 50 is connected to the terminal located at the discharge resistor 51. Once the voltage detection switch 50 is turned off, the operation proceeds to step S130. In step S130, an internal timer TM2 at the control device 7 is started and then the operation proceeds to step S140.

In step S140, a decision is made as to whether or not the length of time being counted with the timer TM2 has reached a predetermined length of time T2. The predetermined length of time T2 should be set to a value indicating the length of time required for the voltage value detected by the voltage sensor 4 to converge to a constant value after the voltage detection switch 50 is turned off. If it is decided that the length of time being counted with the timer TM2 has reached the predetermined length of time T2, the operation waits in standby in step S140, whereas if it is decided that the predetermined length of time T2 has elapsed, the operation proceeds to step S150 in the flowchart presented in FIG. 5.

In step S150, the offset voltage value VOFSET at the voltage sensor 4 is detected. This voltage value is input to the control device 7 via the output terminal 49 at the voltage sensor 4. Once the offset voltage value VOFSET is detected, the operation proceeds to step S160. In step S160, a decision is made as to whether or not the offset voltage value VOFSET detected in step S150 is equal to or higher than a predetermined error decision-making voltage IVSNG. The operation proceeds to step S170 if the offset voltage value VOFSET is determined to be equal to or higher than the error decision-making voltage IVSNG. In step S170, an offset Error decision-making flag FOFNG, which indicates that the offset voltage at the voltage sensor 4 is abnormal, is set to 1 and the value of the offset voltage value VOFSET is set to 0, before the operation proceeds to step S180.

If, on the other hand, it is decided in step S160 that the offset voltage value VOFSET is less than the error decision-making voltage IVSNG, the operation proceeds to step S180. In step S180, the voltage detection switch 50 is turned on before the operation proceeds to step S190. In step S190, the value at the internal timer TM1 at the control device 7 is cleared to 0 and then the timer is restarted, before the operation proceeds to step S200.

In step S200, a decision is made as to whether or not the length of time being counted with the timer TM1 has reached a predetermined length of time T3. The predetermined length of time T3 should be set to a value indicating the length of time required for the voltage value detected by the voltage sensor 4 to stabilize after the voltage detection switch 50 is turned on. The operation waits in standby in step S200 if it is decided that the length of time being counted with the timer TM1 has not reached the predetermined length of time T3, whereas the operation proceeds to step S210 if it is decided that the predetermined length of time T3 has elapsed.

In step S210, the calculation of the voltage value VOLB at the battery module 1 having been interrupted in step S110 is resumed. Subsequently, the voltage value VOLB is used as the value of the control battery voltage VOLBT. Once the calculation of the voltage value VOLB for the voltage at the battery module 1 is resumed, the operation proceeds to step S220. In step S220, the value at the timer TM2 is cleared to 0 and then the operation proceeds to step S230.

In step S230, a decision is made as to whether or not the relationship expressed in (4) below is true. VOLB represents the value of the voltage at the battery module 1 and VSAMP1 represents the voltage value for the battery module 1 having been sampled in step S100. In addition, LIMTVOL represents a voltage value used for voltage fluctuation decision-making.

$$|VOLB-VSAMP1| \geq LIMTVOL \tag{4}$$

The operation proceeds to step S240 if the absolute value of the difference between the voltage value VOLB calculated for the battery module 1 after the voltage detection switch 50 is turned on and the voltage value VSAMP1 calculated for the battery module 1 before the voltage detection switch 50 is turned off is judged to be equal to or greater than the decision-making voltage value LIMTVOL, whereas the operation proceeds to step S250 if the absolute value is less than the decision-making voltage value LIMTVOL.

In step S250, the value of the control battery voltage VOLBT is substituted with the voltage value VOLB calculated for the battery module 1 after the voltage detection switch 50 is turned on and then the operation returns to step S10. In step S240, on the other hand, limit control processing for the control battery voltage VOLBT is executed. The limit control processing for the control battery voltage VOLBT is now explained in detail in reference to the flowchart presented in FIG. 6.

Figure 6:
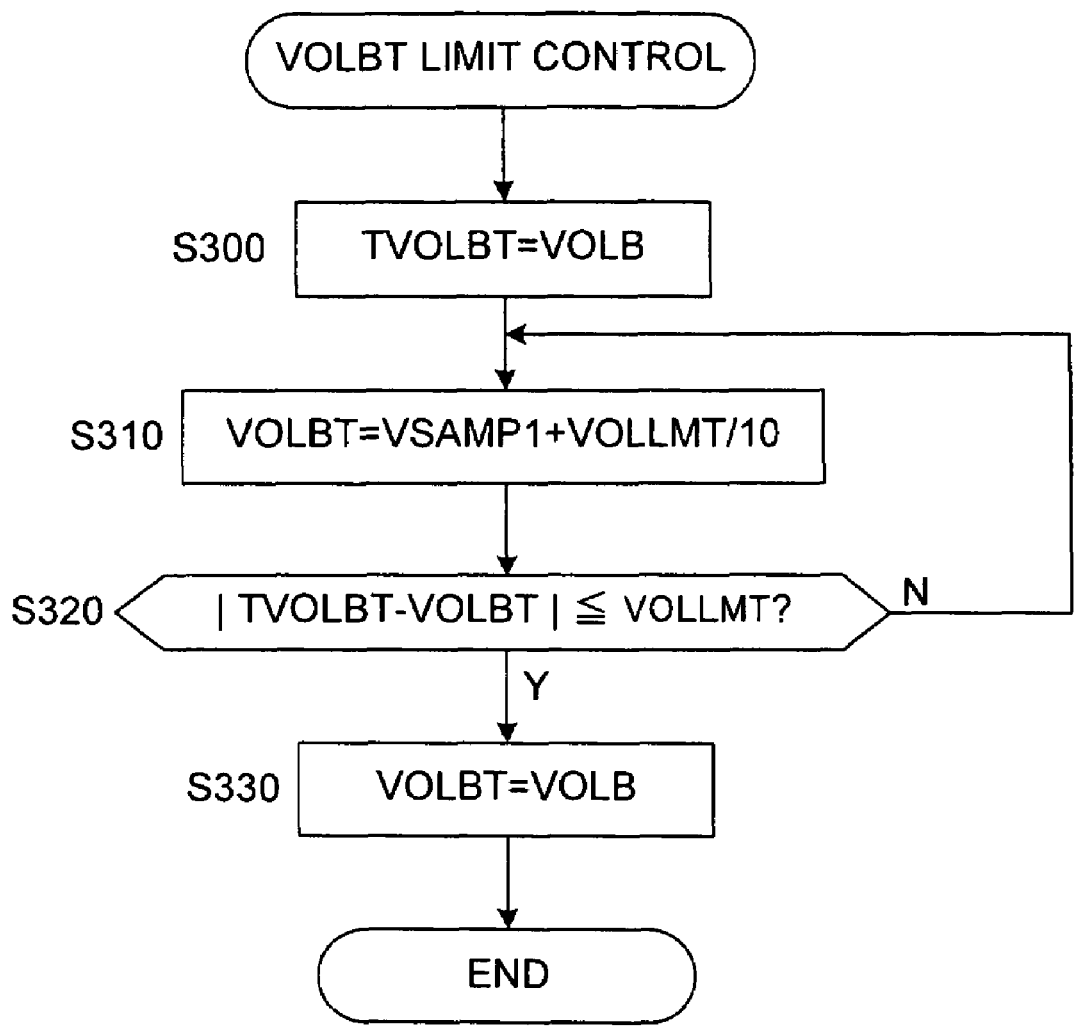
FIG. 6 presents a flowchart of the contents of the limit control processing for the control battery voltage.

In step S300 in the flowchart presented in FIG. 6, the voltage value VOLB calculated for the battery module 1 after the voltage detection switch 50 is turned on is set as a value representing a target battery voltage TVOLBT and then the operation proceeds to step S310. In step S310, the value of the control battery voltage VOLBT is calculated as expressed in (5) below. VOLLMT represents a predetermined voltage limit.

$$VOLBT = VSAMP1 + VOLLMT/10 \tag{5}$$

Namely, if an affirmative decision is made in step S230 in the flowchart presented in FIG. 5, the value calculated as expressed in (5), instead of the battery voltage VOLB calculated as indicated (1), is used for the control battery voltage value VOLBT. Once the control battery voltage value VOLBT is calculated as indicated in (5), the operation proceeds to step S320.

In step S320, a decision is made as to whether or not the absolute value of the difference between the value of the target battery voltage TVOLBT having been set in step S300 and the control battery voltage value VOLBT having been calculated in step S310 is equal to or less than the voltage limit VOLLMT, i.e., whether or not the relationship expressed in (6) below is true.

$$|TVOLBT-VOLBT| \leq VOLLMT \tag{6}$$

If it is decided in step S320 that the relationship expressed in (6) is not true, the operation returns to step S310 to recalculate the value for the control battery voltage VOLBT. However, the calculation is executed as expressed in (7) below when the operation returns from step S320 to step S310 to recalculate the control battery voltage value VOLBT.

$$VOLBT = VOLBT + VOLLMT/10 \tag{7}$$

Namely, until the difference between the target battery voltage value TVOLBT (VOLB) and the control battery voltage value VOLBT becomes equal to or less than the voltage limit VOLLMT, the value obtained by adding VOLLMT/10 to the control battery voltage value VOLBT having been already calculated is used as a new control battery voltage value VOLBT.

If, on the other hand, it is decided in step S320 that the relationship expressed in (6) is achieved, the operation proceeds to step S330. In step S330, the voltage value VOLB at the battery module 1 is used as the control battery voltage value VOLBT, as in the regular control. Once the processing in step S330 is completed, the operation returns to execute the processing in the flowchart presented in FIG. 6. When the processing in step S240 in the flowchart in FIG. 6 ends, the operation returns to step S10. Then, the processing in step S10 and subsequent steps is repeatedly executed.

It is to be noted that the value obtained by subtracting the offset voltage value VOFSET from the control battery voltage VOLBT is used as the voltage value for the battery module 1 to be used in various types of vehicle control, as has been explained earlier.

Figure 7:
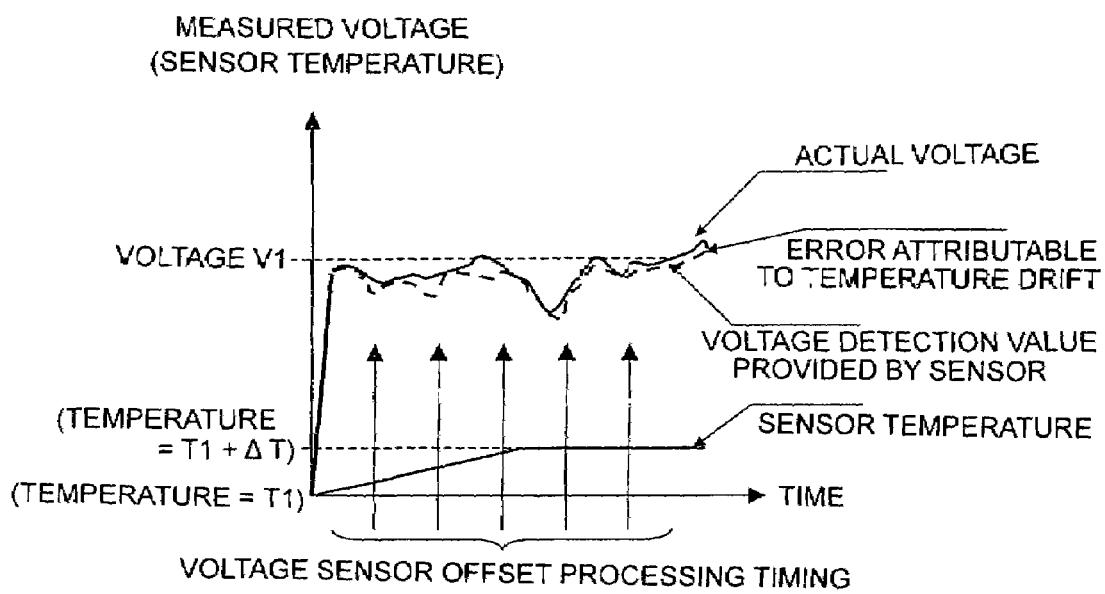
FIG. 7 shows the results of the voltage sensor offset correction executed by the offset correction apparatus for an automotive voltage sensor achieved in the embodiment while the vehicle is traveling.

FIG. 7 shows the results of the offset correction executed by the offset correction apparatus for an automotive voltage sensor achieved in the embodiment for the voltage sensor 4 while the vehicle is traveling. Even when the temperature at the voltage sensor 4 rises from T1 by ΔT, the voltage value for the battery module 1 and the voltage value detected by the voltage sensor 4 remain substantially equal to each other without their difference widening, through the offset correction which is executed repeatedly.

Figure 8:
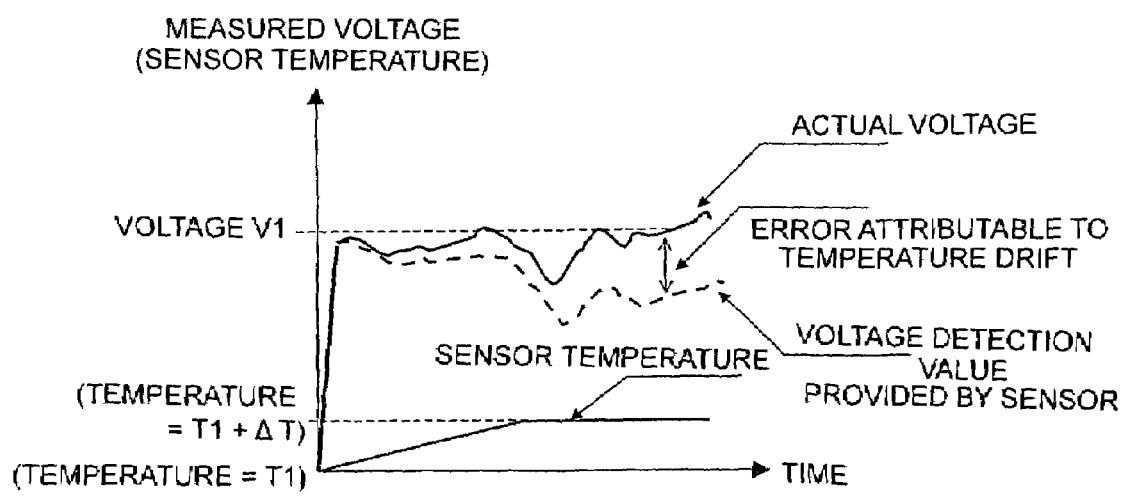
FIG. 8 shows the consequence of not executing any offset correction for the voltage sensor while the vehicle is traveling.

FIG. 8 shows the consequence of not executing any offset correction for the voltage sensor 4 while the vehicle is traveling. In this case, after the temperature at the voltage sensor 4 rises from T1 by ΔT, the difference between the voltage value at the battery module 1 and the voltage value detected by the voltage sensor 4 widens over time, as shown in FIG. 8.

The offset correction apparatus for an automotive voltage sensor achieved in the embodiment disconnects the voltage sensor 4 from the battery module 1 the value of the voltage at which is detected by the voltage sensor 4, obtains the voltage value detected by the voltage sensor 4 in the disconnected state as the offset voltage and corrects the voltage value detected by the voltage sensor 4 based upon the offset voltage thus obtained. As a result, even if an offset error occurs as the temperature at the voltage sensor 4 fluctuates in a traveling state, offset correction can be executed while the vehicle is traveling.

The offset correction apparatus for an automotive voltage sensor achieved in the embodiment detects the offset voltage of the voltage sensor 4 while the vehicle is in a steady traveling state and thus, the extent to which the offset voltage detection affects the vehicle control is minimized. Namely, since the voltage at the battery module 1 cannot be detected while detecting the offset voltage, the offset voltage is detected in a steady traveling state in which the voltage at the battery module does not fluctuate greatly and the voltage value at the battery module 1 detected prior to the offset voltage detection is used as the control battery voltage value VOLBT during the offset voltage detection so as to minimize the extent to which the offset voltage affects vehicle control.

Furthermore, if the difference between a first voltage detected by the voltage sensor 4 prior to the offset voltage detection and a second voltage detected by the voltage sensor 4 following the offset voltage detection is equal to or greater than the voltage fluctuation decision-making voltage LIMTVOL, the offset correction apparatus for an automotive voltage sensor achieved in the embodiment uses a value obtained by applying restrictions to the second voltage value as the control battery voltage value VOLBT. Since this prevents a radical change in the value of the control battery voltage VOLBT, any abrupt change in the vehicular behavior can be prevented as well.

The present invention is not limited to the embodiment described above. In the flowchart presented in FIG. 4, if no abnormality has occurred in the current detection system, a decision is made as to whether or not the present condition enables the offset voltage detection based upon the charge/discharge current value CURBT detected by the current sensor 5, whereas if an abnormality has occurred in the current detection system, a decision is made based upon the vehicle speed detected by the vehicle speed sensor 10 as to whether or not the present condition enables the offset voltage detection. Instead, a decision as to whether or not the offset voltage detection is enabled can always be made based upon the vehicle speed detected with the vehicle speed sensor 10, regardless of whether or not an abnormality has occurred in the current detection system.

If the detected offset voltage value VOFSET is equal to or higher than the error decision-making voltage IVSNG, the offset Error decision-making flag FOFNG is set to 1 and the offset voltage value VOFSET is set to 0. Under these circumstances, a warning lamp or buzzer (not shown) may be used to alert the user that an erroneous value is indicated for the offset voltage.

While the structure of the voltage sensor 4 has been explained in reference to FIG. 2, the voltage sensor 4 may adopt a structure other than that shown in FIG. 2. Namely, the advantages of the present invention are achieved in conjunction with a voltage sensor adopting any structure. In addition, the detection target the voltage value of which is detected by the voltage sensor 4 is not limited to a battery pack constituted with a plurality of cells, and the detection target may instead be a large-capacity capacitor or a fuel-cell.

In the embodiment described above, the offset correction processing is executed as the ignition switch (not shown) is turned on, and following the processing in step S240 or step S250 in the flowchart presented in FIG. 5, the operation returns to step S10 to execute the offset correction processing again. Instead, the processing in step S10 may be started with arbitrary timing.

The disclosure of the following priority application is herein incorporated by reference:

Japanese Patent Application No. 2004-365871 filed Dec. 17, 2004.

What is claimed is:

1. An offset correction apparatus for an automotive voltage sensor, comprising:
   a switching device that is closed to connect a voltage sensor with a voltage detection target and is opened to disconnect the voltage sensor from the voltage detection target;
   an offset voltage obtaining device that obtains as an offset voltage a voltage value detected by the voltage sensor while the voltage detection target and the voltage sensor are disconnected from each other by the switching device; and
   a voltage correction device that corrects the voltage value detected by the voltage sensor based upon the offset voltage obtained by the offset voltage obtaining device, wherein:
   the offset voltage obtaining device obtains the offset voltage when a first predetermined length of time elapses after the switching device is opened to disconnect the voltage detection target and the voltage sensor from each other.

2. An offset correction apparatus for an automotive voltage sensor according to claim 1, wherein:
   the offset voltage obtaining device obtains the offset voltage after a vehicle is started up.

3. An offset correction apparatus for an automotive voltage sensor according to claim 1, wherein:
   the offset voltage obtaining device obtains the offset voltage over intervals each extending over a second predetermined length of time after a vehicle is started up.

4. An offset correction apparatus for an automotive voltage sensor, comprising:
- a switching device that is closed to connect a voltage sensor with a voltage detection target and is opened to disconnect the voltage sensor from the voltage detection target;
- an offset voltage obtaining device that obtains as an offset voltage a voltage value detected by the voltage sensor while the voltage detection target and the voltage sensor are disconnected from each other by the switching device;
- a voltage correction device that corrects the voltage value detected by the voltage sensor based upon the offset voltage obtained by the offset voltage obtaining device; and
- a steady traveling state decision-making device that makes a decision as to whether or not a vehicle is in a steady traveling state, wherein:
- the offset voltage obtaining device starts obtaining the offset voltage once the steady traveling state decision-making device determines that the vehicle is in a steady traveling state.

5. An offset correction apparatus for an automotive voltage sensor according to claim 4, further comprising:
- a current detection device that detects a charge/discharge current at the voltage detection target, wherein:
- the steady traveling state decision-making device determines that the vehicle is in a steady traveling state if an extent of fluctuation manifesting in current values detected a plurality of times by the current detection device during a predetermined length of time is equal to or less than a predetermined value.

6. An offset correction apparatus for an automotive voltage sensor according to claim 4, further comprising:
- a vehicle speed detection device that detects a speed of the vehicle, wherein:
- the steady traveling state decision-making device determines that the vehicle is in a steady traveling state if an extent of fluctuation manifesting in vehicle speed values detected a plurality of times by the vehicle speed detection device during a predetermined length of time is equal to or less than a predetermined value.

7. An offset correction apparatus for an automotive voltage sensor according to claim 4, wherein:
- while the offset voltage obtaining device is obtaining the offset voltage, a voltage value having been detected by the voltage sensor before the voltage detection target and the voltage sensor become disconnected from each other is used as a voltage detection value at the voltage sensor.

8. An offset correction apparatus for an automotive voltage sensor, comprising:
- a switching device that is closed to connect a voltage sensor with a voltage detection target and is opened to disconnect the voltage sensor from the voltage detection target;
- an offset voltage obtaining device that obtains as an offset voltage a voltage value detected by the voltage sensor while the voltage detection target and the voltage sensor are disconnected from each other by the switching device;
- a voltage correction device that corrects the voltage value detected by the voltage sensor based upon the offset voltage obtained by the offset voltage obtaining device; and
- a decision-making device that makes a decision as to whether or not a difference between a first voltage value having been detected by the voltage sensor before the offset voltage is obtained by the offset voltage obtaining device and a second voltage value detected by the voltage sensor after the offset voltage is obtained and then the switching device is closed to connect the voltage detection target and the voltage sensor to each other is equal to or greater than a predetermined voltage value, wherein:
- if the decision-making device judges that the difference between the first voltage value and the second voltage value is equal to or greater than the predetermined voltage value, a value obtained by applying restrictions to the second voltage value is used as a voltage detection value at the voltage sensor.

9. An offset correction apparatus for an automotive voltage sensor according to claim 8, wherein:
- the decision-making device obtains as the second voltage value a voltage value which the voltage sensor detects when a predetermined length of time elapses after the switching device is closed to connect the voltage detection target and the voltage sensor to each other.

* * * * *